United States Patent [19]

Wignot

[11] Patent Number: 5,535,443
[45] Date of Patent: Jul. 9, 1996

[54] NEGATIVE FEEDBACK CONTROL CIRCUIT HAVING A COMMON LINE FOR INPUT AND OUTPUT SIGNAL

[76] Inventor: Leroy S. Wignot, 7505 Fieldstone Ct., Indianapolis, Ind. 46254

[21] Appl. No.: 386,246

[22] Filed: Feb. 9, 1995

Related U.S. Application Data

[63] Continuation of Ser. No. 937,488, Aug. 28, 1992, abandoned.

[51] Int. Cl.⁶ .................................................. H04B 1/26
[52] U.S. Cl. .................................. 455/196.1; 455/197.2; 455/260; 455/316; 455/318
[58] Field of Search .................... 455/195.1, 196.1, 455/197.1, 197.2, 198.1, 259, 260, 264, 183.1, 311, 318, 319, 316; 331/25

[56] References Cited

U.S. PATENT DOCUMENTS

| | | | |
|---|---|---|---|
| 3,959,728 | 5/1976 | Yamazaki et al. | 455/196.1 |
| 4,142,158 | 2/1979 | Belisomi | 455/196.1 |
| 4,837,852 | 6/1989 | Takada et al. | 455/197 |

FOREIGN PATENT DOCUMENTS

| | | | |
|---|---|---|---|
| 190731 | 10/1984 | Japan | 455/318 |

OTHER PUBLICATIONS

Hitachi VCR Model VT–F361A Schematic, Jun., 1992.
Hitachi VCR Model VT F551, AW VCR, Jul. 1991.
Sony Integrated Circuit CXA 1594L Data Sheets.

Primary Examiner—Reinhard J. Eisenzopf
Assistant Examiner—Thanh Le
Attorney, Agent, or Firm—Joseph S. Tripoli; Peter M. Emanuel; Frederick A. Wein

[57] ABSTRACT

A television receiver having an electronically controlled tuner is presented. A controlled local oscillator provides a local oscillator signal for the mixer. The controlled local oscillator includes an first input terminal for receiving a control signal for controlling its frequency and a first output terminal for providing an output local oscillator signal. A phase-locked loop includes a second input terminal for receiving the local oscillator signal and a second output terminal for providing a signal back to the first input terminal of the controlled local oscillator for controlling its frequency. At least a portion of the coupling between the first output terminal and the second input terminal, and the second output terminal and the first input terminal, have a common line.

11 Claims, 2 Drawing Sheets

NEGATIVE FEEDBACK CONTROL CIRCUIT HAVING A COMMON LINE FOR INPUT AND OUTPUT SIGNAL

This is a continuation of application Ser. No. 08/937,488, filed Aug. 28, 1992, now abandoned.

BACKGROUND

The present invention generally concerns a negative feedback control circuit having a common line for input and output signals, and more particularly, a television receiver tuner having a local oscillator which is controlled by a phase-locked loop.

Television receivers include a tuner section for heterodyning received signals, e.g., broadcast or cable RF signals, to produce an intermediate frequency (IF) signal. The IF signal is processed by the IF signal section and the picture and sound components are further processed by respective signal processing sections to produce a video picture signal for displaying an image on a CRT, and to produce an audio signal for producing an audio response by a loudspeaker.

The tuner section includes at least one controlled local oscillator and at least one RF amplifier wherein both have voltage controlled tuning circuits controlled in response to the magnitude of a tuning voltage (TV), which is generated in the exemplary embodiment by the PLL responsive to the selected channel. Typically the tuned circuits include combinations of inductors and varactor diodes which are reverse biased so as to exhibit a variable capacitive reactance having a value determined by the magnitude of the tuning voltage.

Phase locked loop (PLL) tuning systems employ a closed loop negative feedback arrangement for controlling the frequency of the local oscillator signal. The closed loop arrangement includes programmable digital counters as programmable frequency dividers by which a signal is generated which is the frequency to the local oscillator signal divided by a programmable factor related to the selected channel. The programmable frequency divider can be preceded by an optional prescaler circuit which frequency divides the incoming signal by a constant factor. As used herein, statements referring to frequency division, prescaler, and frequency dividers are independent of whether or not the frequency division is programmable.

The frequency and phase of the frequency divided signals are compared by a phase detector to a reference frequency signal to derive a control voltage for controlling the frequency of the controlled local oscillator. For a tuning system employing a PLL, tuning voltage (TV) for tuning the RF amplifiers is also derived from the PLL control voltage developed in response to the channel selected.

The output line from the local oscillator provides an input signal for the PLL. The return output line from the PLL provides the input control signal for the controllable local oscillator. These two lines go from proximally spaced terminals at the PLL to another pair of proximally spaced terminals at the local oscillator. These lines carry high frequency signals which can radiate, and carry pick-up sensitive tuning voltage signals. It is desirable to minimize these adverse effects. Such minimization can be achieved by reducing the length of the lines and/or reducing the number of lines. In particular, reducing the number of lines has the advantage of simplifying printed circuit board layout and reducing the pick-up and radiation produced by printed circuit wiring leads.

SUMMARY OF THE INVENTION

Briefly, the present invention relates to a television receiver having an electronically controlled tuner. A controlled local oscillator provides a local oscillator signal for the mixer. The controlled local oscillator includes an first input terminal for receiving a control signal for controlling its frequency and a first output terminal for providing an output local oscillator signal. A phase-locked loop includes a second input terminal for receiving the local oscillator signal and a second output terminal for providing a signal back to the first input terminal of the controlled local oscillator for controlling its frequency. At least a portion of the coupling between the first output terminal and the second input terminal, and the second output terminal and the first input terminal, have a common line.

DETAILED DESCRIPTION OF THE PREFERRED EMBODIMENT

Figure 1:
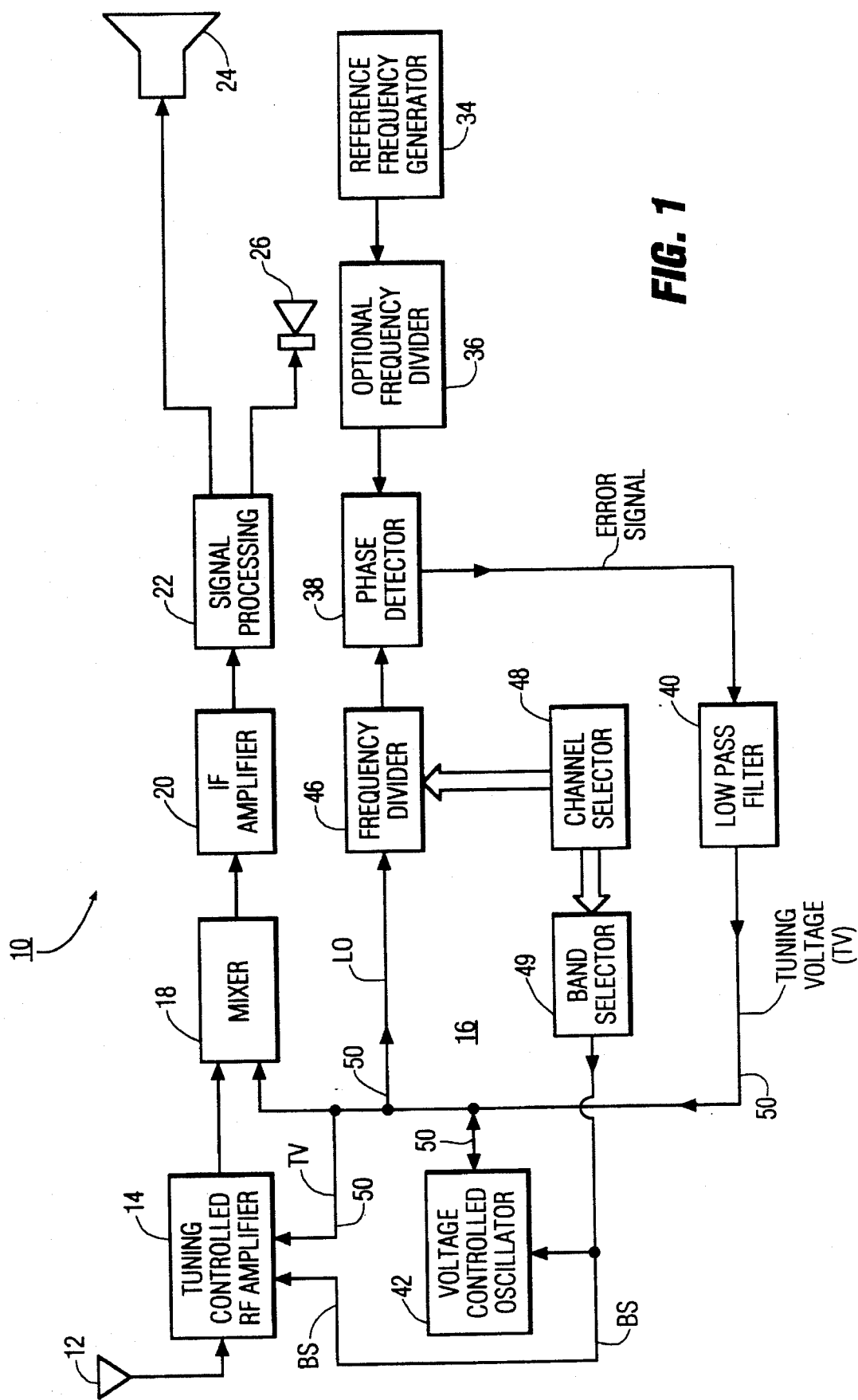
FIG. 1 is a block diagram of a television receiver and a tuner according to aspects of the present invention.

The television receiver 10 of FIG. 1 includes a signal source 12 for receiving radio frequency (RF) television signals and tuning controlled RF amplifiers 14 for tuning and amplifying the received signals. The processed RF signals are combined in a mixer 18 with local oscillator signals generated by a local oscillator 42 controlled by a phase-locked loop 16 to form an intermediate frequency (IF) signal. The IF signal is amplified, filtered and further processed in an IF processing unit 20 and a signal processing unit 22 to provide chrominance, luminance, synchronization, and sound signal components. The chrominance and luminance signals are coupled for providing an image display on kinescope 24 with the sound signals being coupled to a loudspeaker 26.

RF amplifiers 14 typically include a plurality of varactor diodes (not shown) which change capacitive reactance in response to a variable tuning signal in the form of a tuning voltage (TV). Voltage controlled oscillator 42 typically includes a plurality of varactor diodes and inductances with the frequency of oscillation frequency being controlled by control of the capacitance of the varactor diodes by a tuning voltage (TV).

The output signal (LO) of oscillator 42 is coupled to a programmable/prescaler frequency divider 46 which divides the frequency of LO by a factor determined by a channel selector 48 in accordance with the channel number and band of the selected channel. In particular, BCD signals generated by channel selection unit 48 are applied to programmable counters in frequency divider 46. Additionally, band selector 49, generates band selection signals responsive to the band of the selected channel. The band selection signals are coupled to appropriate PIN switching diodes in amplifier 14 and oscillator 42 for changing the circuit configuration for optimizing operation of the respective members in the selected frequency bands.

The output signal of frequency divider 46 is coupled to an input of phase detector 38. Phase detector 38 compares the frequency of the output signal of frequency divider 46 with a reference frequency signal derived from reference frequency generator 34. Generator 34 typically is a crystal oscillator with an output signal which is sometimes frequency divided by an optional frequency divider 36. Phase detector 38 develops an output signal representing the phase and/or frequency deviation between its two input signals. A typical phase detector provides a series of pulses at the reference frequency whose duration is related to the phase and frequency deviation between its two input signals. The output signal of phase detector 38 (error signal) is coupled to a low pass filter 40 which integrates the error signal to provide a very low frequency or DC signal, the amplitude of which varies in accordance with the detected phase and frequency deviations. This variable DC signal (TV) is coupled to the voltage controlled oscillator 42 to control its frequency of oscillation. In operation, the output signal of filter 40 controls the frequency of the local oscillator signal until the frequency and phase of the output signals of dividers 36 and 46 are in a predetermined relationship, e.g., substantially equal. At this point, phase-locked loop 16 is said to be "locked". The filtered error signal is also used for providing the tuning voltage (TV) for RF amplifiers 14.

As seen in FIG. 1, line 50 provides tuning voltage TV to oscillator 42 and amplifier 14. Additionally, the same line 50 also provides the local oscillator signal LO from oscillator 42 to frequency divider 46. Thus, both the input signal and the output signal from the negative feedback control circuit, which in the exemplary embodiment is a PLL, are on a single line, and as explained above, permit a reduction of the number of lines which must be used with the advantage of simplifying printed circuit board layout, and reducing the pick-up and radiation produced by the printed circuit wiring leads.

Figure 2:
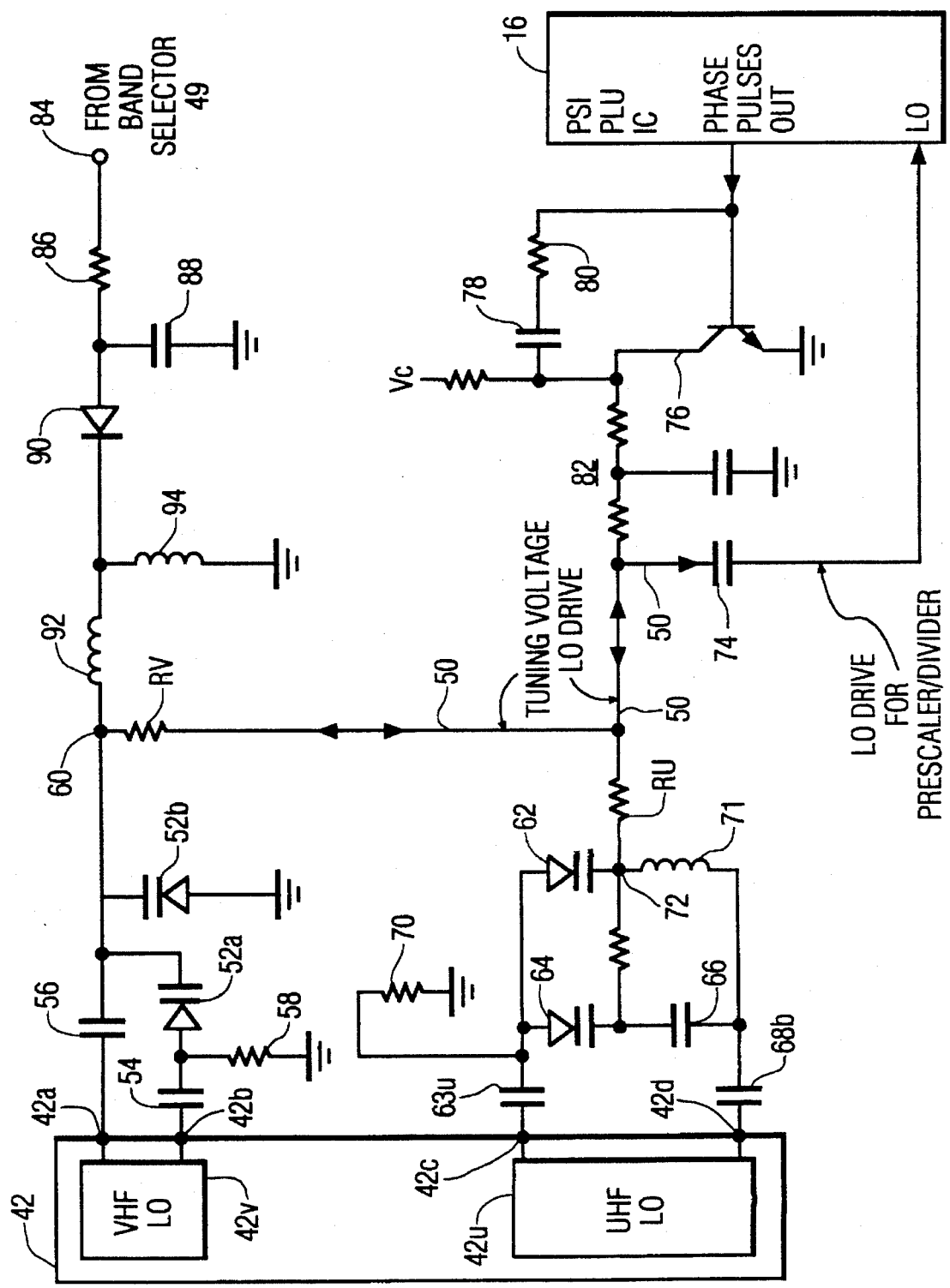
FIG. 2 is a partial detailed schematic of the controllable local oscillator and phase-locked loop of FIG. 1.

FIG. 2 shows particular details of the coupling circuit between local oscillator (LO) 42 and PLL 16. The voltage controlled oscillator 42, generally shown FIG. 1, actually comprises two oscillators, a UHF LO 42U and a VHF LO 42V. In the exemplary embodiment, these oscillators are portions of the CXA1594L integrated circuit manufactured by the Sony Corporation. Components of the PLL 16, i.e., frequency divider 46, phase detector 38, etc. can be any appropriate PLL IC, the exemplary IC being a Siemens MGP 3002X.

Tuning varactor diodes 52a,b, padder capacitor 54, and coupling capacitor 56 are coupled to LO 42V at terminals 42a,b. Resistor 58 provides a DC ground return for varactor diode 52a. The output signal from LO 42V at node 60 is coupled to line 50 via resistor RV, with the tuning voltage from line 50 being applied via node 60 to tuning varactor diodes 52a,b.

Tuning varactor diodes 62, 64, padder capacitor 66, and coupling capacitors 68a,b are coupled to LO 42U at terminals 42c,d. Resistor 70 provides a DC ground return for varactor diodes 62, 64. Coil 71 helps LO 42U maintain oscillation across its band of frequencies. The output signal from LO 42U at node 72 is coupled to line 50 via resistor RU, with the tuning voltage from line 50 being applied via node 72 to tuning varactor diodes 62, 64.

Line 50 provides input signals from VHF LO 42V and UHF LO 42U, coupled through capacitor 74 to the LO input of PLL 16, e.g., divider 46. In the exemplary embodiment, only one of local oscillators 42V and 42U are "turned on" at any one time. The phase pulses from phase detector 38 (error signal) are low pass filtered by transistor 76 having a low pass feedback network of capacitor 78 and resistor 80, and further filtered by low pass network 82. The output signal of network 82 provides the tuning voltage TV and is also fed back to oscillator 42 via line 50. The tuning voltage TV is fed via line 50 and resistors RV and RU to respective varactor diodes of oscillators 42V and 42U for controlling the oscillation frequency of said oscillators in a manner discussed above in connection with FIG. 1. Tuning signal TV is blocked from the frequency divider 46 by capacitor 74 which is only 8 picofarads (pf).

The values of resistors RU and RV are chosen to accommodate conflicting requirements. It is desirable that the values of resistors RU and RV be small so that a higher and more reliable drive voltage will be provided to PLL 16. However, if resistors RU and RV are too small, the tank circuits of the oscillators may be sufficiently loaded by the low input impedance of the PLL, which in the exemplary embodiment is bipolar, so that the oscillators may not reliably oscillate. In the exemplary embodiment, values of one kohm for each of resistors RU and RV were found to work well.

In the VHF frequency range, a bandswitching signal from band selector 49 is fed to terminal 84 and low pass filtered by resistor 86 and capacitor 88. In the lower frequency range of the VHF band, the bandswitching voltage at terminal 84 is low and PIN switching diode 90 remains open. In this mode, series inductances 92 and 94 provide maximum inductance to VHF oscillator 42V for a lower frequency of oscillation. For bandswitching to the higher VHF band, the bandswitching voltage at terminal 84 is high causing PIN diode 90 to conduct and shunts capacitor 88 across inductance 94 effectively removing inductance 94 from the circuit. Thus, for the higher VHF band, the inductance in the VHF oscillator circuit 42V is lower for generating a higher frequency of oscillation.

I claim:

1. An apparatus comprising:
   a first oscillator for generating a first oscillator signal including a first frequency control variable impedance responsive to a control signal for controlling the frequency of the first oscillator, and
   a control means for generating said control signal in response to the frequency of the first oscillator signal, said first oscillator signal being coupled from the first oscillator to the control means and said control signal being coupled from the control means to the first oscillator entirely through a single common electrically conductive path directly connected to the first frequency control variable impedance of said first oscillator.

2. The apparatus of claim 1 wherein the first frequency control variable impedance is a varactor diode.

3. The apparatus of claim 1 wherein the control means comprises a phase locked loop.

4. The apparatus of claim 1 further comprising a second oscillator for generating a second oscillator signal including a second frequency control variable impedance responsive to the control signal for controlling the frequency of the second oscillator;
   said control signal being generated in response to the frequency of the second oscillator signal, said second oscillator signal being coupled from the second oscillator to the control means and said control signal being coupled from the control means to the second oscillator entirely through the single common electrically conductive path directly connected to the second frequency control variable impedance of said second oscillator.

5. The apparatus of claim 4 wherein the second frequency control variable impedance is a varactor diode.

6. The apparatus of claim 4 wherein the control means comprises a phase locked loop.

7. The apparatus of claim 4 wherein the common path includes at least one isolation resistor.

8. An apparatus comprising:

a first oscillator for generating a first oscillator signal including a first varactor diode responsive to a control signal for controlling the frequency of the first oscillator, and a control means for generating said control signal in response to the frequency of the first oscillator signal, said first oscillator signal being coupled from the first oscillator to the control means and said control signal being coupled from the control means to the first oscillator entirely through a single common electrically conductive path directly connected to a cathode of the first varactor diode of said first oscillator.

9. The apparatus of claim 8 further comprising a second oscillator for generating a second oscillator signal including a second varactor diode responsive to the control signal for controlling the frequency of the second oscillator;

said control signal being generated in response to the frequency of the second oscillator signal, said second oscillator signal being coupled from the second oscillator to the control means and said control signal being coupled from the control means to the second oscillator entirely through the single common electrically conductive path directly connected to a cathode of the second varactor diode of said second oscillator.

10. An tuning control apparatus for tuning a receiver to a selected one of a plurality of channels, comprising:

a first oscillator for generating a first oscillator signal including a first frequency control variable impedance responsive to a control signal for controlling the frequency of the first oscillator, and a control means for generating said control signal in response to the frequency of the first oscillator signal and to a selected predetermined frequency, said first oscillator signal being coupled from the first oscillator to the control means and said control signal being coupled from the control means to the first oscillator entirely through a single common electrically conductive path directly connected to the first frequency control variable impedance of said first oscillator.

11. The tuning apparatus of claim 10 further comprising a second oscillator for generating a second oscillator signal including a second frequency control variable impedance responsive to the control signal for controlling the frequency of the second oscillator;

said control signal being generated in response to the frequency of the second oscillator signal and to a selected predetermined frequency, said second oscillator signal being coupled from the second oscillator to the control means and said control signal being coupled from the control means to the second oscillator entirely through the single common electrically conductive path directly connected to the second frequency control variable impedance of said second oscillator.

* * * * *